United States Patent
Kobayashi (10) Patent No.: US 7,605,660 B1
(45) Date of Patent: Oct. 20, 2009

(54) LINEAR MULTI-STAGE TRANSIMPEDANCE AMPLIFIER

(75) Inventor: Kevin W. Kobayashi, Torrance, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 11/938,721

(22) Filed: Nov. 12, 2007

(51) Int. Cl.
*H03F 3/08* (2006.01)

(52) U.S. Cl. ............... 330/308; 330/278; 330/291; 330/254

(58) Field of Classification Search ............ 330/308, 330/278, 291, 254
See application file for complete search history.

(56) References Cited

U.S. PATENT DOCUMENTS

| | | | |
|---|---|---|---|
| 5,532,471 A | 7/1996 | Khorramabadi et al. | 250/214 A |
| 5,912,586 A * | 6/1999 | Mitzlaff | 330/149 |
| 6,081,603 A * | 6/2000 | Engh et al. | 381/120 |
| 6,297,701 B1 | 10/2001 | Visocchi et al. | 330/308 |
| 6,404,281 B1 | 6/2002 | Kobayashi | 330/85 |
| 6,504,429 B2 * | 1/2003 | Kobayashi | 330/85 |
| 6,720,827 B2 | 4/2004 | Yoon | 330/85 |
| 7,148,749 B2 * | 12/2006 | Rahman et al. | 330/279 |
| 7,265,626 B2 * | 9/2007 | Teo et al. | 330/279 |
| 7,342,454 B2 * | 3/2008 | Sekimoto et al. | 330/279 |

* cited by examiner

*Primary Examiner*—Patricia Nguyen
(74) *Attorney, Agent, or Firm*—Withrow & Terranova, P.L.L.C.

(57) ABSTRACT

An apparatus comprising a first amplifier circuit, a detect circuit, a control circuit and a second amplifier circuit. The first amplifier circuit may be configured to generate an amplified signal in response to an input signal. The detect circuit may be configured to generate a feed-forward signal in response to the amplified signal. The control circuit may be configured to generate a dynamic control signal in response to the feed-forward signal. The second amplifier circuit may be configured to generate an output signal in response to (i) the amplified signal and (ii) the dynamic control signal. The control circuit may be configured to control a gain of the second amplifier circuit by adjusting a magnitude of the dynamic control signal.

21 Claims, 9 Drawing Sheets

LINEAR MULTI-STAGE TRANSIMPEDANCE AMPLIFIER

FIELD OF THE INVENTION

The present invention relates to amplifiers generally and, more particularly, to a method and/or apparatus for implementing a linear multi-stage transimpedance amplifier.

BACKGROUND OF THE INVENTION

As fiber optic data transmission speeds increase, higher linearity will be needed from physical media dependent (PMD) Integrated Circuits (ICs) such as transimpedance amplifiers, modulators and/or laser drivers. In particular, higher linearity transimpedance amplifiers will be needed to support higher order modulation schemes such as differential phase-shift keying (DPSK) or binary phase-shift keying (BPSK), electronic dispersion compensation (EDC), and burst mode data transmission systems.

One conventional solution for implementing a wide dynamic range transimpedance amplifier uses a DC restore topology for linearizing a single-ended pre-amplifier stage of a multi-stage transimpedance amplifier. In addition, the transimpedance amplifier offset correction under power drive (which does not use feedback), enables such correction to be applied to a 40 Gigabit per second (Gbs) burst-mode transimpedance amplifier. However, such an implementation has room for overall linearity improvement.

Conventional approaches for linearizing the second stage of a transimpedance amplifier often implement a differential limiter amplifier. Such an implementation typically has used some sort of signal detection near the output of the transimpedance amplifier that is fed back to an intermediate stage configured for automatic gain control.

A differential limiter amplifier also allows the integration of a differential offset correction using a common detection circuit. However, because the detection is done near the output, significant distortion of the signal occurs before the automatic gain control loop can effectively reduce the signal to reduce the distortion. This may lead to residual or multiplicative distortion. In addition, feedback automatic gain control is not conducive of high performing burst-mode transimpedance amplifier operation due to the delay in the feedback signal.

Figure 1:
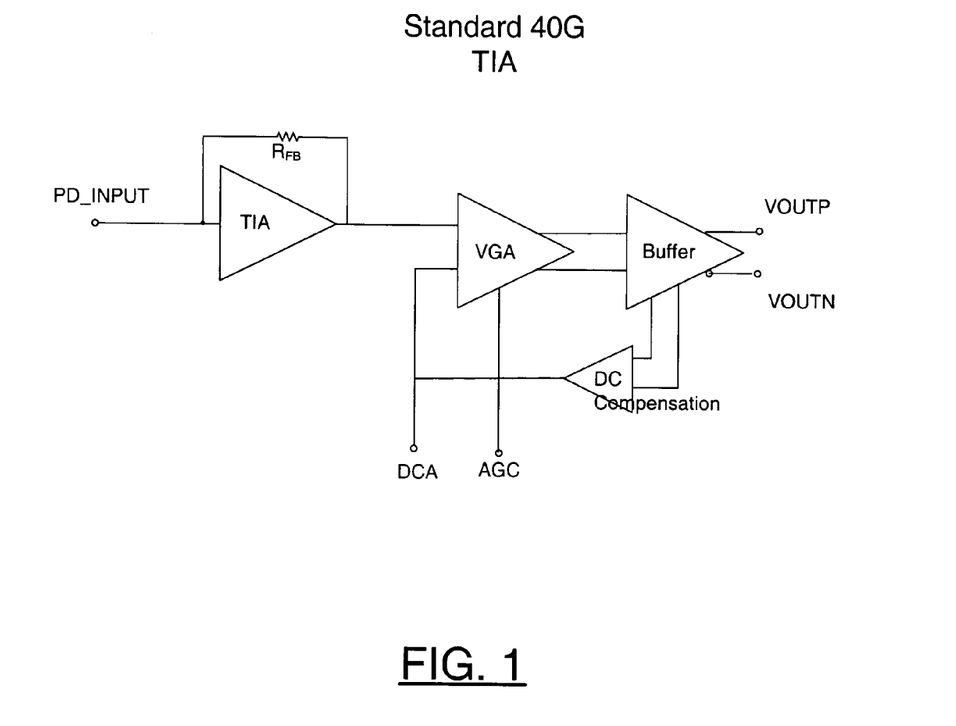
FIG. 1 is a block diagram of a conventional multi-stage transimpedance amplifier.

Referring to FIG. 1, a block diagram of a conventional transimpedance amplifier is shown. Typically a multi-stage transimpedance amplifier designed for 40 Gbs is fabricated in high speed SiGe, CMOS, InP HBT, or PHEMT technologies. Most implementations use three stages to obtain the desired high transimpedance gain. The three stages include a transimpedance amplifier preamplifier followed by a differential VGA (or post or limiting) amplifier. The differential amplifier section connects to an output buffer stage to interface with a 50 ohm system. When implementing a design in silicon technologies, the first stage is usually a differential amplifier due to the lack of backside vias or good single-ended grounds. When implementing a design in InP or GaAs HBTs or PHEMTs, the first stage is normally single-ended and will use a DC restore loop to linearize the input stage.

For a silicon differential input transimpedance amplifier preamplifier employment, a DC compensation loop is usually fed back to the unused differential input, similar to what is depicted for the VGA stage in FIG. 1, but wrapped all the way to a preceding differential input preamplifier stage. In most conventional approaches, the DC compensation loop shown in FIG. 1 will be implemented where a signal is detected at the output buffer stage (or a stage close to the output so a significant signal is detected). The DC compensation loop will be fed back to the un-driven port of a preceding differential amplifier VGA stage which is driven single-endedly. Such a loop corrects the output offset created from driving only one input of a VGA stage. Such a loop improves duty cycle distortion caused by imbalanced excitation of the VGA stage.

In order to linearize the operation of the VGA stage (assuming the transimpedance amplifier preamplifier output has already been linearized in the case of a preceding single-ended transimpedance amplifier), a signal level is usually also detected at or near the output buffer stage and is fed back to an automatic gain control port of a VGA amplifier stage that has gain control capability.

It would be desirable to enhance the linearity of the second stage of a transimpedance amplifier to support DPSK modulation and/or electronic dispersion compensation (EDC) applications in a manner that may also be compatible with burst-mode operation.

SUMMARY OF THE INVENTION

The present invention concerns an apparatus comprising a first amplifier circuit, a detect circuit, a control circuit and a second amplifier circuit. The first amplifier circuit may be configured to generate an amplified signal in response to an input signal. The detect circuit may be configured to generate a feed-forward signal in response to the amplified signal. The control circuit may be configured to generate a dynamic control signal in response to the feed-forward signal. The second amplifier circuit may be configured to generate an output signal in response to (i) the amplified signal and (ii) the dynamic control signal. The control circuit may be configured to control a gain of the second amplifier circuit by adjusting a magnitude of the dynamic control signal.

The objects, features and advantages of the present invention include providing a system that may (i) improve the overall linearity of a multi-stage transimpedance amplifier, (ii) combine automatic gain for the immediate successive differential stage after a linearized DC restored input preamplifier stage, (iii) combine a common signal detection network for both (a) DC restore linearization and (b) feed-forward automatic gain control of the first successive differential stage, (iv) employ feed-forward automatic gain control using early detection, (v) employ a delay element in the feed-forward path in order to reduce distortion due to simultaneous amplitude modulation due to (a) the first DC restore feedback loop and (b) the feed-forward gain control, and/or (vi) employ the feed-forward control signal in a two stage (e.g., Cherry-Hooper) differential feedback amplifier.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention provides detection and adjustment in a transimpedance amplifier application early in the signal path. The signal detection is normally provided just after a preamplifier stage, and is fed forward towards a successive stage. The feed-forward may provide gain reduction when a large signal is present. With such a configuration, gain control leveling is done earlier without feedback. Such a configuration may be desirable for burst-mode implementation and may enable greater product applicability.

The present invention may provide a number of improvements over existing approaches. DC compensation may be accomplished by detecting a signal at the transimpedance amplifier (TIA) preamplifier output, then splitting and feeding forward an average DC level of equal amplitude to both sides of the successive VGA amplifier stage. In one example, DC restore feedback and feed-forward gain control signals may be simultaneously generated from a detection circuit. The detection is done early in the gain chain near the transimpedance amplifier output to prevent multiplicative distortion in successive stages that could disturb an output detection circuit. Through a specific network, one control signal is fed back through a DC restore network for preserving linearity under high optical excitation, and another control signal is fed forward to a post amplifier variable gain amplifier (VGA) in a specific manner for preserving the signal linearity of the first input differential pair of the VGA. The feed-forward may involve using a two stage differential feedback VGA amplifier. Such an amplifier may optimally achieve small signal gain-bandwidth, and may implement gain control of the output differential pair to maintain linearity under large signal excitation.

The present invention may improve the overall linearity of a multi-stage transimpedance amplifier by combining automatic gain of the immediate successive differential stage after a linearized DC restored input pre-amplifier stage. The present invention may combine a common signal detection network after the preamplifier for both DC restore linearization feedback of the preamplifier and feed-forward automatic gain control (AGC) of the first successive differential stage for improving linearity and transimpedance amplifier overload.

The present invention may employ feed-forward automatic gain control using early signal detection, compared with conventional later detection and a feedback automatic gain control. A delay element may be implemented in the feed-forward path in order to reduce distortion due to simultaneous AM modulation of the signal envelop due to (i) the first DC restore feedback loop, and (ii) the feed-forward gain control. In one example a feed-forward control signal may be presented to a two stage (e.g., Cherry-Hooper) differential feedback amplifier may be implemented where the automatic gain control signal is applied to the second differential pair for controlling the amount of feedback to the first stage.

Figure 2:
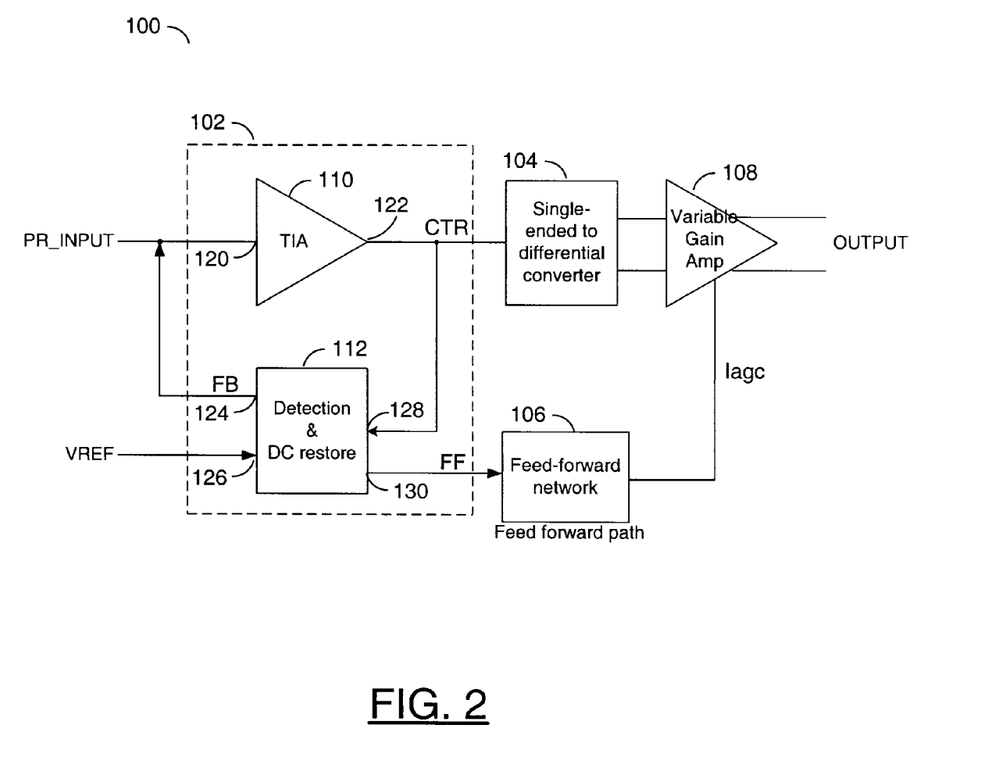
FIG. 2 is a block diagram of a basic embodiment of the present invention.

Referring to FIG. 2, a block diagram of a circuit 100 is shown in accordance with a preferred embodiment of the present invention. The circuit 100 may be implemented as a wide dynamic range (e.g., 40 Gbs) transimpedance amplifier. The circuit 100 includes a block (or circuit) 102, a block (or circuit) 104, a block (or circuit) 106, and a block (or circuit) 108. The circuit 102 may be implemented as an input section. The circuit 102 generally comprises an amplifier 110 and a block (or circuit) 112. The amplifier 110 may be implemented as a preamplifier transimpedance amplifier. The circuit 112 may be implemented as a detection and DC restore stage. The circuit 104 may be implemented as a converter circuit. In one example, the circuit 104 may be implemented as a single-ended to differential converter circuit. The circuit 106 may be implemented as a feed-forward circuit. The circuit 108 may be implemented as an amplifier. In one example, the circuit 108 may be implemented as a variable gain amplifier. In another example, the circuit 108 may be implemented as a two stage differential feedback amplifier.

Various elements of the circuit 100, such as the pre-amplifier circuit 102 and the single-ended to differential converter circuit 104, are described in U.S. Pat. No. 6,504,429 and U.S. Pat. No. 6,404,281, which are hereby incorporated by reference in their entirety. The details of the preamplifier circuit 102 and single-ended to differential converter circuit 104 will not be discussed in detail, except in relation to the present invention and/or applications of the present invention.

The present invention involves combining a common-detector to create an additional feed-forward control signal to vary the gain of a following differential post amplifier in order to improve the linearity of the next successive differential pair (in the signal path) just after the output of the preamplifier 110. Using a common detector point for both of these functions reduces the effects of the parasitic loading of multiple detector tap points along the signal path through the multi-stage amplifier. Employing the detector circuit 112 earlier in the multi-stage amplifier chain allows a clean and effective implementation of both DC restore and optional automatic gain control functions. Detection earlier in the signal path normally allows a more accurate determination of signal level strength before non-linear distortion occurs. The further down the chain toward the output that a detector is placed, the more effect the non-linear distortion will have on the detection function.

The circuit 110 generally comprises an input 120 and an output 122. The input 120 may receive a signal (e.g., PR_INPUT). The output 122 may present a signal (e.g., CTR). The circuit 112 may have an output 124, an input 126, an input 128, and an output 130. The output 124 may present a signal (e.g., FB) that may be combined with the signal PR_INPUT and presented to the input 120. The signal FB may be an optional control signal that may not be implemented in particular embodiments. The input 126 may receive a reference signal (e.g., VREF). The output 130 may present a signal (e.g. FF). The input 128 may receive the signal CTR. The signal FF may be a feed-forward signal. The detection circuit 112 normally detects a signal level of the signal CTR generated by the preamplifier transimpedance amplifier 110. The feed-forward signal FF is normally presented to the circuit 106.

The circuit 106 may be a feed-forward circuit configured to provide one or more of the following (i) convert from voltage to current, (ii) employ an adjustable delay for optimizing the effectiveness of the feed-forward signal, (iii) filter high frequency noise, and/or (iv) produce a DC tail current to a differential pair amplifier of a post VGA or limiting differential amplifier that follows the preamplifier TIA. In one example, the variable gain amplifier 108 may be implemented as a two stage differential feedback amplifier.

The present invention may employ a common detector to produce control signals for both feedback DC restore and a feed-forward automatic gain control function. A delay may be used in the feed-forward control path to optimize the effectiveness of the automatic gain control function in various applications including burst-mode operation. The feed-forward signal FF controls the second differential pair of the 2-stage feedback amplifier for adjusting (e.g., reducing) the amount of feedback signal amplitude that is presented to the first differential pair of the combined 2-stage feedback amplifier. This controlled amount of feedback reduces the level of distortion produced at the collector output of the first differential pair of the 2-stage feedback amplifier for producing a more linear amplified signal response.

Figure 3:
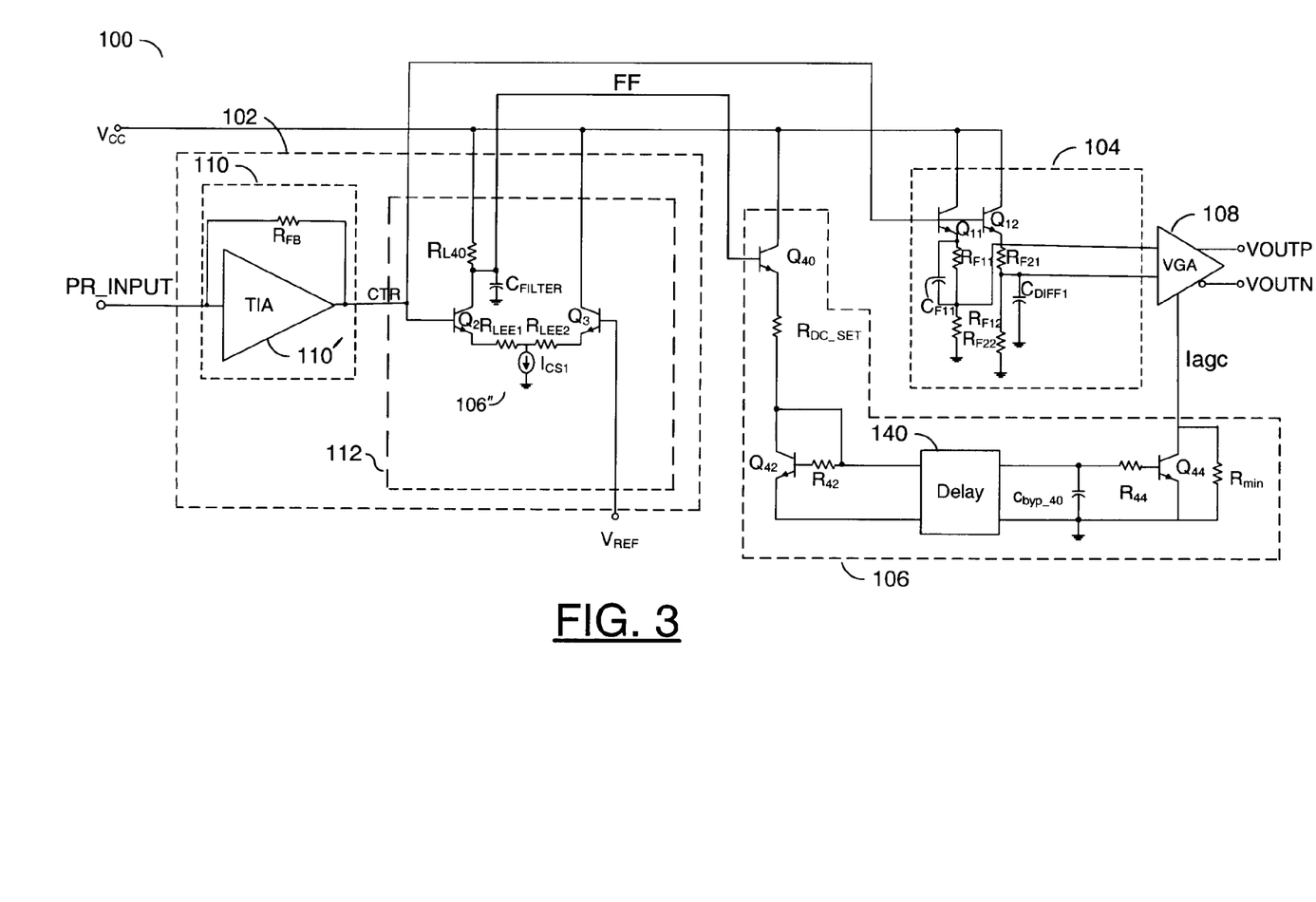
FIG. 3 is a more detailed diagram of the present invention.

Referring to FIG. 3, a more detailed diagram of the circuit 100 is shown. The circuit 110 generally comprises an amplifier 110' and a resistor. The resistor RFB may be implemented as a feedback resistor. In one example, the amplifier 110' may be implemented as a non-inverting transimpedance amplifier. The circuit 112 generally comprises a transistor QFB, a transistor Q2, a transistor Q3, a resistor RE, a resistor RB, a resistor RL40, a resistor RLEE1, a resistor RLEE2, a capacitor CFILTER, and a current source ICS1. The circuit 104 generally comprises a transistor Q11, a transistor Q12, a resistor RF11, a resistor RF21, a resistor RF22, a resistor RF12, a capacitor CF11 and a capacitor CDIF1. The circuit 106 generally comprises a transistor Q40, a transistor Q42, a transistor Q44, a resistor RDC_SET, a resistor R42, a resistor R44, a resistor RMIN, a capacitor CBYP_40, and a delay circuit 140. The details of the basic operation of the circuit 104, and the circuit 112 are discussed in detail in U.S. Pat. Nos. 6,504,429 and 6,404,281.

Figure 4:
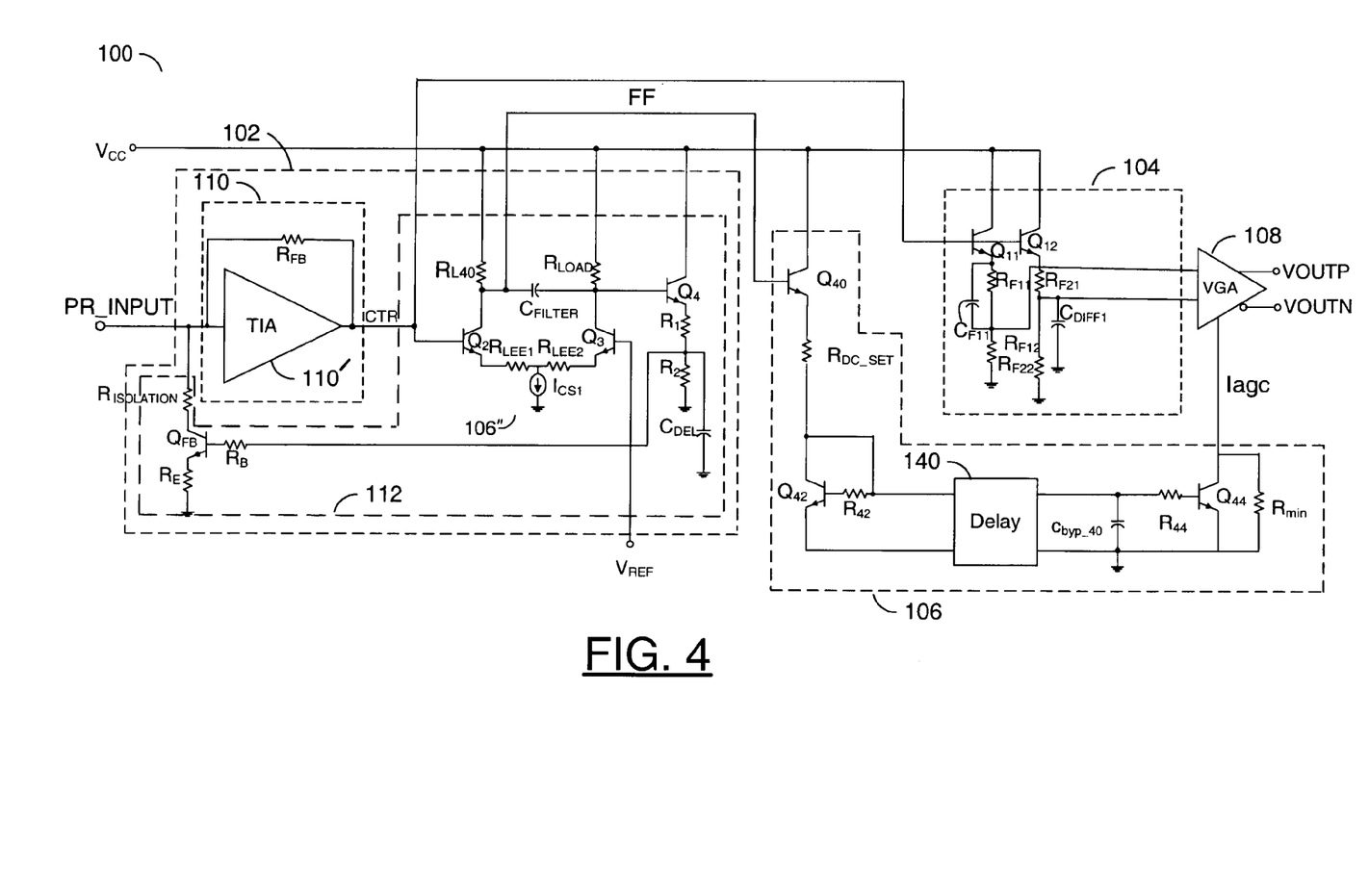
FIG. 4 is a more detailed diagram of an alternate embodiment of the present invention.

Referring to FIG. 4, a more detailed diagram of an alternate embodiment of the circuit 100 is shown. The circuit 112 is shown further comprises a transistor Q4, a resistor R1, a resistor R2, a resistor RLOAD, and a capacitor CDEL. The capacitor CFILTER is shown connected between the resistor RLOAD and a base of the transistor Q4.

The detector and DC restore circuit 112 incorporates the load resistor RL40 and the filter capacitor CFILTER connected across the differential transistor pair Q2 and Q3. The load resistor RL40 and the filter capacitor CFILTER may provide the control signal FF (having an opposite polarity) for controlling the feed-forward network 106. Taking the complementary outputs of the differential pair Q2 and Q3 may allow simultaneous control signals to be provided to both the DC restore feedback loop and feed-forward automatic gain control functions as needed.

The detector circuit 112 may also include peak detection and optimized time constants on both feed-forward and feedback paths for application to burst-mode operation. The size of the capacitor CFILTER may be implemented to be large enough to filter out the high frequencies, leaving an integrated (e.g., RSS) DC signal. The time constant of such integration may be determined by the combined value of the resistor RL40 and the capacitor CFILTER. The value of the resistor RL40, with respect to the reference voltage VREF and the tail current ICS1, may be optimized to produce a wide DC voltage range presented to the feed-forward network 106 (e.g., as the input photo current is increased) to automatically adjust the gain of the VGA. Because the detector circuit 112 detects the output signal from the pre-amplifier 110 at an early point in the amplifier chain, the DC restore and automatic gain control functions will become more effective compared to the conventional approach illustrated in FIG. 1. In general, less distortion of the signal is being detected by the detector network to inhibit corruption of the correction control signal FF.

The resulting feed-forward control signal FF passes through the feed-forward network 106. The transistor Q40 may be implemented as a follower buffer transistor. The resistor RDC_SET may be implemented as a DC set resistor. The transistors Q42 and Q44 may be implemented as a current mirror. The resistors R42 and R44 may be implemented as base resistors connected to the delay element 140. The resistor RMIN may be implemented as a minimum current source resistor. The capacitor CBYP_40 may be implemented as a bypass filter capacitor.

The feed-forward circuit 106 may convert the voltage control signal FF into a current source "tail" current which provides bias current to a differential amplifier of VGA 108 to control gain and signal level. The resistor RDC_SET, along with the transistor Q42 and the transistor Q44, normally determine the quiescent current of the current source and bias current of a differential stage of the VGA. The base resistors R42 and R44 help to provide a higher input impedance and also act as isolation and/or stability resistors. The capacitor CBYP_40 may operate as a low pass filter in conjunction with the resistors R44 and R42. Since the transistors Q42 and Q44 are current mirrors, the resistors R42 and R44 may scale inversely with area of the mirror transistors in order to maintain mirror operation. The delay element 140 may be used to offset the simultaneous modulation of the signal swing by the DC restore feedback loop and the feed-forward automatic gain control, in order to optimize linearity performance and/ or burst-mode operation.

As input photo-current excitation increases due to higher optical power, the voltage of the feed-forward control signal FF decreases which consequently reduces the current through the current mirror and current source provided to the VGA. The resistor RMIN sets a minimum bias current source in the case where the input excitation becomes large and shuts the feed-forward current mirror network off. The value of the resistor RMIN may be optimized through simulations. The resistor RMIN may keep the VGA stage functioning as an amplifier when a very large signal is detected. The overall effect of the automatic gain control is to reduce the gain of the VGA 108 and the signal level provided to a successive output buffer stage in order to improve the linearity of the overall amplifier chain. When there is no input photo current, the detector circuit 112 provides a predetermined DC voltage to the feed-forward network 106 that sets the quiescent current source and bias of the VGA at its high gain state.

In one example, the VGA 108 may be implemented as a 2-stage differential feedback amplifier. The feed-forward network 106 may be applied to the second differential pair of the 2-stage feedback amplifier.

Figure 5:
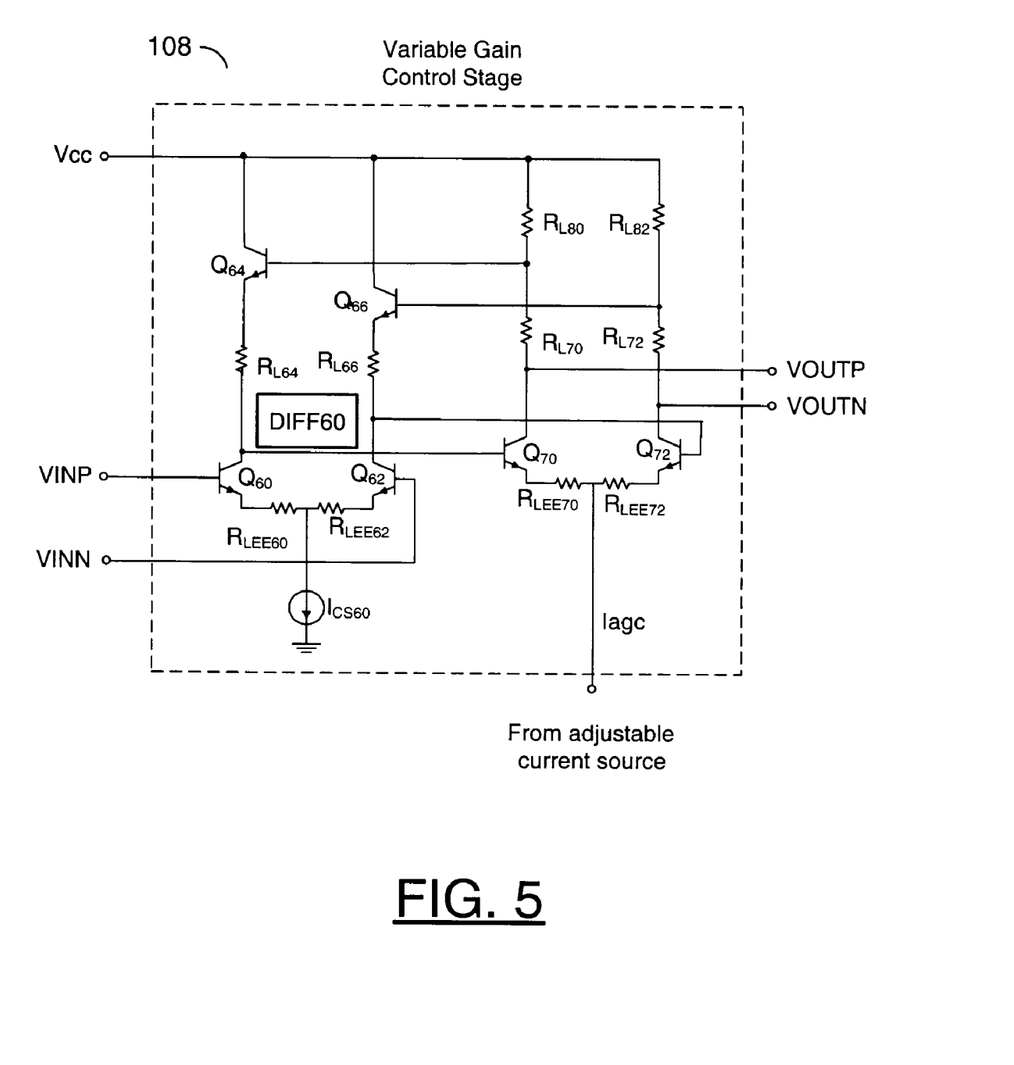
FIG. 5 is a block diagram of the variable gain amplifier stage implemented as a two stage differential feedback amplifier.

Referring to FIG. 5, a block diagram of the VGA stage 108 is shown. The circuit 108 may be implemented as a 2 stage differential feedback amplifier. The circuit 108 generally comprises a transistor Q60, a transistor Q62, a transistor Q64, a transistor Q66, a transistor Q70, a transistor Q72, a resistor RL64, a resistor RL66, a resistor RLEE60, a resistor RLEE62, a resistor RL80, a resistor RL82, a resistor RL70, a resistor RL72, a resistor RLEE70, a resistor RLEE72 and a current source ICS60.

The circuit 108 may provide superior gain-bandwidth performance which allows excellent wideband response. Circuits similar to the circuit 108 are often used in high speed 40 Gbps transimpedance amplifiers due to a wide small signal transimpedance response. The differential transistor pair Q60 and Q62 may be referred to as a first stage, a first pair or an input pair. The transistors Q60 and Q62 normally have associated emitter and load resistors RLEE60, RLEE62 and RL64, RL66, respectively. The fixed current source ICS60 may provide a fixed bias current. The emitter resistors RLEE60 and RLEE62 may be employed to help linearize the stage. Such linearization may occur at the expense of added thermal noise. The load resistors RL64 and RL66 may be adjusted along with the current source ICS60 to provide an appropriate voltage level swing at the output of the first differential pair Q60 and Q62. The outputs of the first differential pair Q60 and Q62 are normally directly coupled to the transistors Q70 and Q72.

The transistor pair Q70 and Q72 may be referred to as a second stage, second pair, or a second differential pair. The transistor pair Q70 and Q72 normally has associated emitter resistors RLEE70 and RLEE72 and associated load resistors RL70, RL72, RL80, and RL82. The resistive loads may be split, which allows optimization of the amount of feedback. The transistors Q64 and Q66 may be referred to as a follower transistor pair. An internal feedback signal may flow from the transistor pair Q70 and Q72, through the transistors Q64 and Q66, to the transistors Q60 and Q62. The follower pair Q64 and Q66 provides feedback coupling to the loads of the first differential pair Q60 and Q62, as well as to the bases of the second differential pair Q70 and Q72.

In general, the larger the ratio of the resistors RL80 and RL82 to the resistors RL70 and RL72, the larger the amount of feedback signal and the wider the small-signal gain-bandwidth response of the 2-stage VGA 108. This topology has become very popular for greater than 40 Gbs applications due to these characteristics. However, the drawback of this topology is that as the ratio of the resistors RL80 and RL82 to the resistors RL70 and RL72 increases to maximize bandwidth, the larger the feedback signal level presented to the loads of the input differential pair Q60 and Q62 and the more feedback distortion resulting at the collectors of the input differential pair Q60 and Q62 (to be discussed in more detail in the context of the simulations of FIGS. 5-8). As the level of the input signal increases, so does the feedback signal which results in more distortion. In order to reduce the large signal distortion of this topology, the present invention implements the feed-forward network 106. The dynamic current source IAGC1 may be applied to the second differential pair Q70 and Q72 to reduce the amount of feedback signal amplitude or swing in the presence of a large input signal.

Simulations were done on a multi-stage transimpedance amplifier similar to the one shown in FIG. 3. An additional buffer stage may be added to the topology of FIG. 3 to complete the 4 stage TIA. InP HBT technology with fT ~175 GHz was used to simulate the performance. The feed-forward network 106 and the variable current source IAGC is applied directly to the output differential stage of the VGA 108 in order to reduce the distortion of the first (and previous) differential pair stages.

Figure 6A:
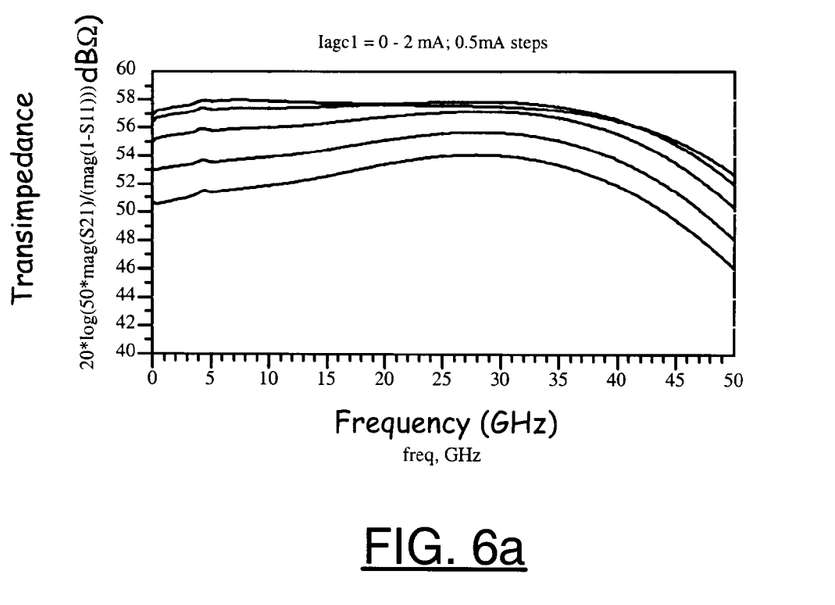
FIG. 6 is an illustration of the gain control response of the transimpedance amplifier of FIG. 3.
Figure 6B:
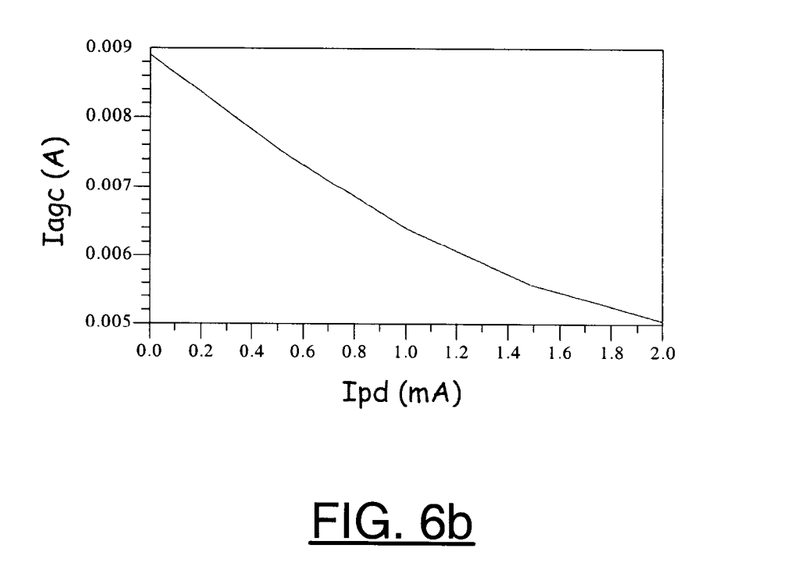

Referring to FIGS. 6a-b, an illustration of the gain control response of the transimpedance amplifier of FIGS. 3 and 4 is shown. FIGS. 6a-b illustrate the gain control response of a InP HBT multi-stage transimpedance amplifier employing the present invention. FIG. 6a illustrates the wide band transimpedance response as a function of input photo current Ipd. FIG. 6a illustrates that between 4 and 6 dB of gain control may be realized over a input photo current range from 0 to 2 mA. As Iph increases, the gain of the transimpedance amplifier decreases. FIG. 6b illustrates the associated current source current IAGC as a function of the input photo current. The current IAGC is approximately linear and monotonic over the 2 mA Ipd excitation range. The resistor RMIN is adjusted to limit the minimum bias current IAGC of the VGA stage in order to ensure adequate amplification at low gain and high input signals.

Figure 7A:
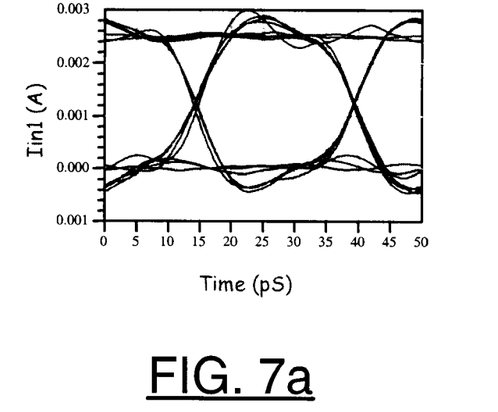
FIG. 7 is an illustration of a simulated eye response without a feedback DC restore loop and without a feed-forward automatic gain control.
Figure 7B:
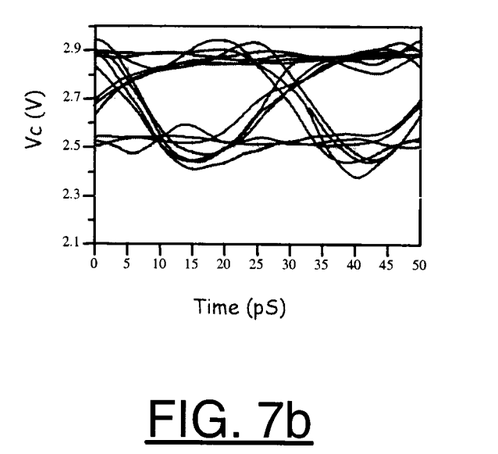
Figure 7C:
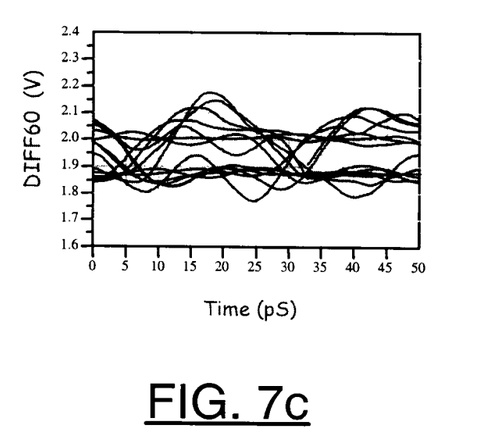

Referring to FIGS. 7a-c, illustrations of a simulated eye response with no feedback DC restore and no feed-forward automatic gain control is shown. FIGS. 7a-c illustrate the multi-stage transimpedance amplifier where the feedback DC restore loop and feed-forward automatic gain control functions are disabled. FIGS. 7a, 7b, and 7c illustrate the simulated 40 Gbs eye patterns at the input of the transimpedance amplifier (IIN1), the output of the preamplifier stage (VC), and the collector nodes of the first differential pair of the 2-stage feedback VGA (DIFF60). The 0-2 mA input photo current open eye is shown in (a). The output of the preamplifier illustrates a distorted eye is shown in (b). The collectors of the first stage diff-pair of the VGA illustrates a poorly distorted closed eye is shown in (c).

Figure 8A:
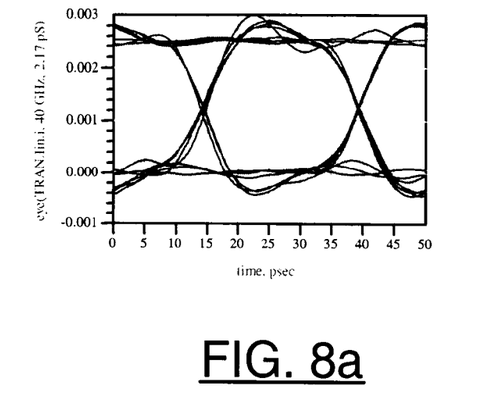
FIG. 8 is an illustration of a simulated eye response with feedback DC restore but without feed-forward automatic gain control.
Figure 8B:
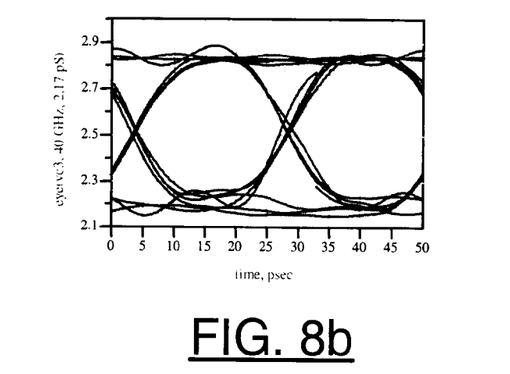
Figure 8C:
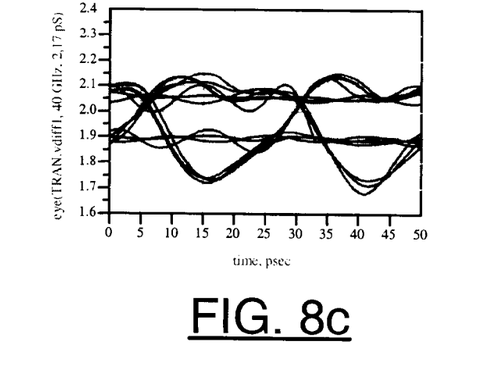

Referring to FIGS. 8a-c, illustrations of a simulated eye response with feedback DC restore but no feed-forward automatic gain control is shown. FIGS. 8a-c illustrate the multi-stage transimpedance amplifier where the feedback DC restore loop is enabled but the feed-forward automatic gain control function is disabled. FIGS. 8a, 8b, and 8c illustrate the simulated 40 Gbs eye patterns at the input of the transimpedance amplifier (IIN1), the output of the preamplifier stage (VC), and the collector nodes of the first differential pair of the 2-stage feedback VGA (DIFF60).

The 0-2 mA input photo current open eye is shown in (a). The output of the preamplifier illustrates a clean open eye, a result of the DC restore employment, is shown in (b). The collectors of the first stage diff-pair of the VGA illustrates a very ringy, distorted eye which is nearly closed, is shown in (C). This poor eye is a result of an overbearing feedback signal coming from the 2nd stage differential pair of the VGA 108 that is superimposed on the original signal presented to the base inputs of the second differential pair. This is due to the large resistors RL80 and RL82 compared to the resistors RL70 and RL72 required to optimize the small signal transimpedance gain bandwidth response. Under large signal excitation, the large ratio produces an amount of feedback signal which ultimately distorts the collector outputs of the input differential pair.

Figure 9A:
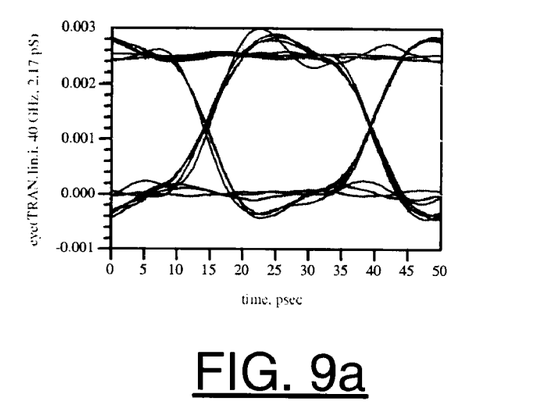
FIG. 9 is an illustration of a simulated eye response with feedback DC restore and with feed-forward automatic gain control.
Figure 9B:
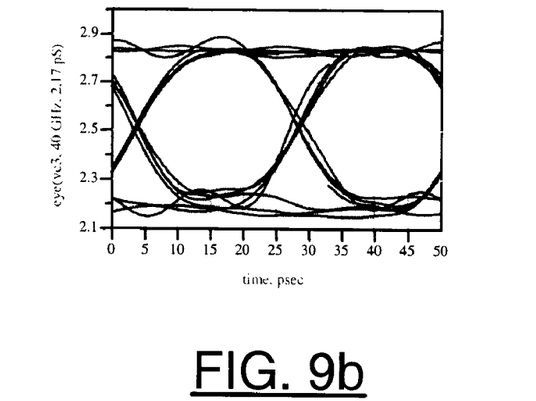
Figure 9C:
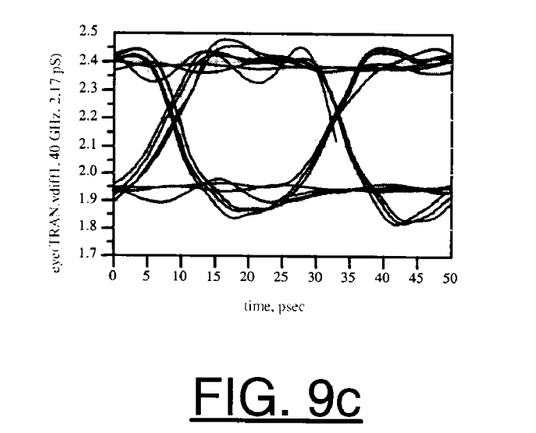

Referring to FIGS. 9a-c, an illustration of a simulated eye response with feedback DC restore and with feed-forward automatic gain control is shown. FIGS. 9a-c illustrate the multistage transimpedance amplifier where both the feedback DC restore loop AND the feed-forward automatic gain control function are enabled. FIGS. 9a, 9b, and 9c illustrate the simulated 40 Gbs eye patterns at the input of the transimpedance amplifier (IIN1), the output of the preamplifier stage (VC), and the collector nodes of the first differential pair of the 2-stage feedback VGA (DIFF60).

The 0-2 mA input photo current open eye is shown in (a). The output of the preamplifier illustrates a clean open eye, a result of the DC restore employment is shown in (b), and the collectors of the first stage diff-pair of the VGA now illustrates an open eye which is a big improvement over that of FIG. 8c is shown in (c). This open eye is a result of the reduction of the amplitude of the feedback signal produced from the second stage differential pair of the VGA 108. The open eye demonstrates the effectiveness of the present invention to enable greater dynamic range. The present invention also enables the practical employment of the two stage feedback amplifier 108, which is known for its gain bandwidth characteristics, but not particularly know for its linearity.

The present invention has direct applications to: 40G VSR, FFTH, MAN/Metro, 40G burst-mode for super computing or data links, higher order modulation DPSK, lower data rate fiber applications and possible wireless RF LNA architectures for high dynamic range portable applications.

As used herein, the term "simultaneously" is meant to describe events that share some common time period but the term is not meant to be limited to events that begin at the same point in time, end at the same point in time, or have the same duration.

The transistors described herein may be implemented as bipolar junction transistors (BJTs), heterojunction bipolar transistors (HBTs), double heterojunction bipolar transistors (DHBT) or pseudomorphic high electron mobility transistors (PHEMT). However, other transistors with similar characteristics may be implemented to meet the design criteria of a particular implementation. In particular, the various transistors of the present invention may be implemented using a variety of process technologies. For example, any or all semiconductors, including compound semiconductors, III-V semiconductors, Silicon Germanium (SiGe), Indium Gallium Phosphorous (InGaP), Indium Phosphide (InP), or Gallium Arsenide (GaAs) may be used. However, other process technologies may be implemented to meet the design criteria of a particular implementation.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
    a first amplifier circuit comprising a transimpedance amplifier (TIA) pre-amplifier circuit and configured to generate an amplified signal in response to an input signal;
    a detect circuit configured to generate a feed-forward signal in response to said amplified signal;
    a control circuit configured to generate a dynamic control signal in response to said feed-forward signal; and
    a second amplifier circuit configured to generate an output signal in response to (i) said amplified signal and (ii) said dynamic control signal, wherein said control circuit is configured to control a gain of said second amplifier circuit by adjusting a magnitude of said dynamic control signal.

2. An apparatus comprising:
    a first amplifier circuit configured to generate an amplified signal in response to an input signal;
    a detect circuit configured to generate a feed-forward signal in response to said amplified signal and configured to generate a feedback signal in response to said amplified signal;
    a control circuit configured to generate a dynamic control signal in response to said feed-forward signal; and
    a second amplifier circuit configured to generate an output signal in response to (i) said amplified signal and (ii) said dynamic control signal, wherein said control circuit is configured to control a gain of said second amplifier circuit by adjusting a magnitude of said dynamic control signal.

3. The apparatus according to claim 2, wherein said detect circuit generates said feedback signal and said feed-forward signal in further response to a reference voltage.

4. The apparatus according to claim 1, further comprising:
    a converter circuit configured to generate a differential amplified signal in response to said amplified signal.

5. The apparatus according to claim 2, wherein said first amplifier circuit comprises a transimpedance amplifier (TIA) pre-amplifier circuit.

6. An apparatus comprising:
    a first amplifier circuit configured to generate an amplified signal in response to an input signal;
    a detect circuit configured to generate a feed-forward signal in response to said amplified signal;
    a control circuit configured to generate a dynamic control signal in response to said feed-forward signal; and
    a second amplifier circuit comprising a variable gain two-stage feedback amplifier (VGA) and configured to generate an output signal in response to (i) said amplified signal and (ii) said dynamic control signal, wherein said control circuit is configured to control a gain of said second amplifier circuit by adjusting a magnitude of said dynamic control signal.

7. The apparatus according to claim 1, wherein said apparatus comprises a multi-stage transimpedance amplifier with automatic gain control.

8. The apparatus according to claim 7, wherein said feed-forward signal is configured to control a second differential pair of said second amplifier to linearize a first differential pair of said second amplifier.

9. The apparatus according to claim 8, wherein a gain of said second differential pair controls said linearization of said first differential pair.

10. The apparatus according to claim 8, wherein an amplitude of an internal feedback signal of said second amplifier controls a linearization of said first and second differential pairs of said second amplifier.

11. The apparatus according to claim 2, wherein said feedback signal provides DC compensation and said feed-forward signal provides an automatic gain control.

12. The apparatus according to claim 1, wherein said control circuit comprises a feed-forward circuit comprising a delay element, wherein said delay element is configured to optimize an overall linearity of said apparatus.

13. The apparatus according to claim 1, wherein said second amplifier comprises a Cherry-Hooper amplifier.

14. The apparatus according to claim 1, wherein said detector circuit is configured to provide a combination of peak detection and RMS detection.

15. The apparatus according to claim 1, wherein said control signal comprises a control current.

16. The apparatus according to claim 1, wherein said amplifier is implemented in an all NPN bipolar process.

17. The apparatus according to claim 2, wherein said first amplifier comprises a single-ended preamplifier transimpedance amplifier.

18. The apparatus according to claim 2, wherein said first amplifier comprises a non-inverting preamplifier transimpedance amplifier.

19. The apparatus according to claim 2, wherein said apparatus is configured to operate in a burst-mode operation by (i) adjusting one or more time constants of the detect circuit, the feed-forward signal and the feedback signal, and (ii) implementing peak detection.

20. The apparatus according to claim 2, wherein said control circuit simultaneously generates said feedback and said feed forward signals.

21. The apparatus according to claim 2, wherein said control circuit comprises a feed-forward circuit comprising a delay element, wherein said delay element is configured to optimize an overall linearity of said apparatus.

* * * * *